United States Patent [19]

Kimura

[11] Patent Number: 4,470,080

[45] Date of Patent: Sep. 4, 1984

[54] CIRCUIT FOR DETECTING FREQUENCY MODULATED SIGNAL

[75] Inventor: Kenji Kimura, Tachikiawa, Japan

[73] Assignee: Olympus Optical Co. Ltd., Japan

[21] Appl. No.: 375,306

[22] Filed: May 5, 1982

[30] Foreign Application Priority Data

May 14, 1981 [JP] Japan ................................. 56-71342

[51] Int. Cl.$^3$ ........................... G11B 5/04; G11B 5/02
[52] U.S. Cl. ......................................... 360/30; 360/67
[58] Field of Search .............................. 360/30, 33, 67;
358/315, 330, 36

[56] References Cited

U.S. PATENT DOCUMENTS 4,186,411  1/1980  Numakura ............................. 360/30
4,291,343  9/1981  Riddle, Jr. ............................. 360/30

Primary Examiner—Vincent P. Canney
Attorney, Agent, or Firm—Parkhurst & Oliff

[57] ABSTRACT

In order to reproduce an image signal from a frequency modulated wave which is obtained by frequency modulating a carrier with the image signal and picked-up from a magnetic tape by means of a magnetic head, the picked-up frequency modulated wave is supplied to a high pass filter for deriving a frequency modulated fundamental wave which is then supplied to a first limiter circuit to derive a first rectangular wave in response to zero crossings of the fundamental wave. Positive and negative pulse trains are generated by positive and negative pulse generators, respectively in response to front and rear edges, respectively of the first rectangular wave and are combined with each other in a first mixer to produce a combined pulse train. Then, the combined pulse train is superimposed in a second mixer upon the reproduced frequency modulated wave to produce a frequency modulated wave having the combined pulse train superimposed thereon, which is then supplied to a second limiter circuit to produce a second rectangular wave in response to zero crossings of the superimposed frequency modulated wave. The second rectangular wave thus produced is supplied to a detecting circuit and is demodulated to reproduce the image signal.

10 Claims, 17 Drawing Figures

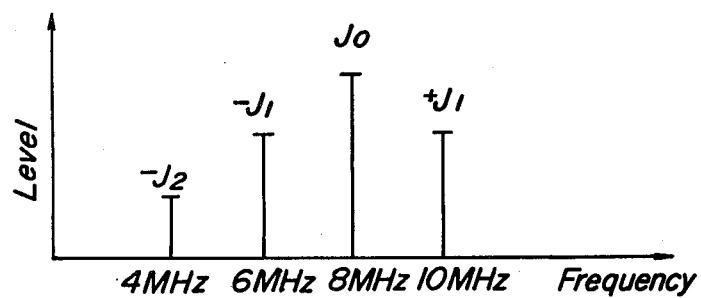
FIG. 3
PRIOR ART
FIG. 4A
FIG. 4B
FIG. 4C
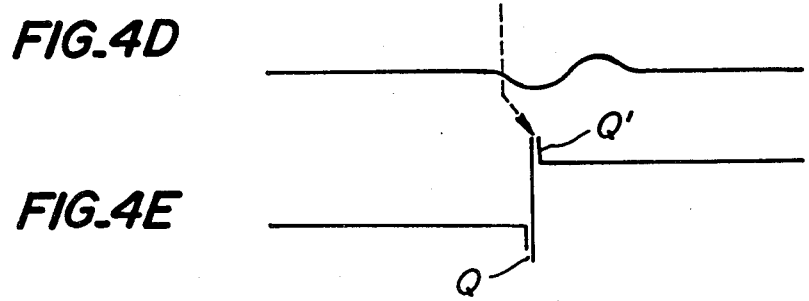
FIG. 4D
FIG. 4E

CIRCUIT FOR DETECTING FREQUENCY MODULATED SIGNAL

BACKGROUND OF THE INVENTION

The present invention relates to a circuit for demodulating a frequency modulated wave to reproduce an image signal, and more particularly to a circuit for preventing a lack of a carrier signal in the reproduced frequency modulated wave where the frequency modulated wave is recorded with a high modulation index.

In a magnetic image signal recording and reproducing apparatus such as a video tape recorder, a frequency modulated wave obtained by modulating a carrier with an image signal is recorded on a magnetic record medium such as a magnetic tape and the frequency modulated wave thus recorded is picked-up by a magneto-electric converting element such as a magnetic head to reproduce the frequency modulated wave. In such an apparatus, when the frequency modulated wave having a high modulation index is recorded, the following problem might occur.

In case of recording and reproducing a signal by means of a magnetic head having a finite gap width, an electromagnetic converting characteristic of a reproduced signal differs from an ideal characteristic curve a of 6 dB/octave and becomes curves b, c and d due to spacing loss, tape thickness loss and gap loss of the magnetic head, respectively. Therefore, the actual characteristic is dumped in a higher frequency range due to a total influence of these losses as shown by a curve e in FIG. 1.

In general, the image signal has a frequency band of several MHz and a carrier frequency to be modulated with the image signal should have a frequency higher than twice of the image signal frequency in order to avoid any interference between the carrier and the image signal. For this purpose, the carrier frequency, i.e. a fundamental frequency of the frequency modulated wave should usually be selected within a range of 8 to 10 MHz. Therefore, a frequency range F in which the reproduced level is reduced to a great extent has to be used in order to increase a utilization factor of the magnetic tape by effecting a high density recording.

FIG. 2 is a block diagram of a typical known magnetic video tape recording and reproducing apparatus. An image signal received at an input terminal 1 is supplied to an emphasis circuit 2 in order to improve a signal to noise ratio of a reproduced signal by emphasizing side-band components of the frequency modulated wave. After emphasizing higher frequency components in the circuit 2, the image signal is supplied to a frequency modulator 3 in which a carrier is frequency modulated with the image signal to produce a frequency modulated wave. The frequency modulated wave thus derived is supplied, through switch 4 actuated into a record side, to a magnetic head 5 and is recorded on a magnetic tape 6 which travels past the magnetic head 5 at a constant speed.

Upon reproduction, the switch 4 is actuated into a reproduction or play side and the frequency modulated wave recorded on the magnetic tape 6 is picked-up by the magnetic head 5 and the picked-up frequency modulated wave is supplied to an equalizer circuit 7. In the equalizer circuit 7, the reduction of high frequency component in the picked-up wave as shown by the curve e in FIG. 1 is compensated for. The frequency modulated wave thus compensated for is further supplied to a limiter circuit 8 to detect zero cross points of the reproduced frequency modulated wave. The detected zero cross signal representing only the frequency modulated component is supplied to a detector circuit 9 to multiply the frequency in order to prevent any interference between the frequency modulated wave and the image signal.

In a pulse count detection system, a pulse series having a constant pulse width is produced from the frequency multiplied signal and the pulse signal thus generated is supplied to a low pass filter 10 to remove the carrier component in the reproduced frequency modulated wave to derive as an output signal an average value of the pulse series. The output signal from the low pass filter 10 is further supplied to a de-emphasis circuit 11 for restoring the original high frequency component which has been emphasized by the emphasis circuit 2 during the recording. In this manner, a reproduced image signal having the same characteristic as that of the original image signal supplied to the input terminal 1 is derived at an output terminal 12.

Now it is assumed that the image signal has a frequency range up to 2 MHz and the fundamental frequency of the frequency modulated wave is set to 8 MHz, a frequency spectrum of the frequency modulated wave is as shown in FIG. 3. That is to say, a fundamental component $J_0$ appears at 8 MHz and lower and upper side-band components such as $-J_1$, $-J_2$ and $+J_1$ appear at lower and upper frequencies remote from the fundamental frequency by integer multiplies of 2 MHz. Usually in the magnetic recording and reproducing apparatus of a lower side-band system the upper side band components such as $+J_1$ are not recorded and only the lower side-band components such as $-J_1$, $-J_2$ are recorded.

In the known magnetic recording and reproducing apparatus so far explained, there occurs a serious problem when the image signal changes abruptly. That is to say, when the image signal changes from a black peak level to a white peak level as illustrated in FIG. 4A, undesired noise called as an inverting phenomenon might be produced in the reproduced image signal. Now, the reason for generating such undesired phenomenon will be explained with reference to waveforms shown in FIGS. 4A to 4E.

In the recording process, the high frequency component of image signal shown in FIG. 4A is emphasized by the emphasis circuit 2 and thus, the image signal is converted into a differentiated wave as illustrated in FIG. 4B. Due to the principle of frequency modulation, the side-band components of the frequency modulated wave are emphasized and recorded on the magnetic tape 6. Therefore, upon the reproduction, the carrier frequency, i.e. the fundamental frequency is shifted toward a higher frequency at the emphasized side-band components and at the same time the side-band components $-J_1$ and $-J_2$ shown in FIG. 3 are reproduced with an emphasized magnitude. Further, in the magneto-electric converting characteristic, the high frequency component is dumped and the middle frequency component is increased as illustrated by the curve e in FIG. 1. Therefore, the side-band components $-J_1$ and $-J_2$ are further emphasized and thus, the frequency modulated wave shown in FIG. 4C is reproduced, in which the side-band components illustrated in FIG. 4D are superimposed upon the frequency modulated wave. The signal shown in FIG. 4C is derived from the equalizer circuit 7 and the side-band components are reduced to some extent by the frequency correcting action of the equalizer circuit 7. However, at the abrupt change of the image signal, the carrier component in the reproduced frequency modulated wave does not cross with a zero level L as shown by points P and P'. Then, the limiter circuit 8 does not produce an output signal or does produce a noise component which has been superimposed upon the reproduced frequency modulated wave. Therefore, in the reproduced image signal there are produced spike-like noises Q and Q' as illustrated in FIG. 4E at the abrupt change point of the original image signal. Such noises cause the so-called inverting phenomenon and there appears undesired noise in a reproduced picture.

SUMMARY OF THE INVENTION

The present invention has for its object to provide a circuit for reproducing an image signal from a frequency modulated signal obtained by frequency modulating a carrier with the image signal, which circuit can obviate the inverting phenomenon which might occur in a reproduced image signal at an abrupt level change of the image signal.

According to the invention, a circuit for detecting a frequency modulated signal for use in a picture recording and reproducing apparatus including a circuit for frequency modulating a carrier with an image signal to produce a frequency modulated wave and a converting element for recording the frequency modulated wave on a record medium and for picking-up the recorded frequency modulated wave from the record medium to produce a reproduced frequency modulated wave, comprises A first limiter circuit for detecting a fundamental wave in the reproduced frequency modulated wave to produce a first rectangular wave;

a pulse generator for producing, in response to the first rectangular wave, pulses having a constant pulse width which is shorter than a period of the maximum frequency of the reproduced frequency modulated wave;

a circuit for superimposing the pulses of the constant pulse width upon the reproduced frequency modulated wave to produce a superimposed frequency modulated wave;

a second limiter circuit for converting the superimposed frequency modulated wave into a second rectangular wave; and a detector circuit for demodulating the second rectangular wave to reproduce the image signal.

BRIEF DESCRIPTION OF THE DRAWINGS

FIG. 3 is a graph showing a frequency spectrum of a frequency modulated wave;

FIGS. 4A to 4E are waveforms for explaining how to produce an inverting phenomenon in the known apparatus shown in FIG. 1;

FIGS. 6A to 6H are waveforms for explaining an operation of the circuit shown in FIG. 5.

DESCRIPTION OF THE PREFERRED EMBODIMENTS

Figure 1:
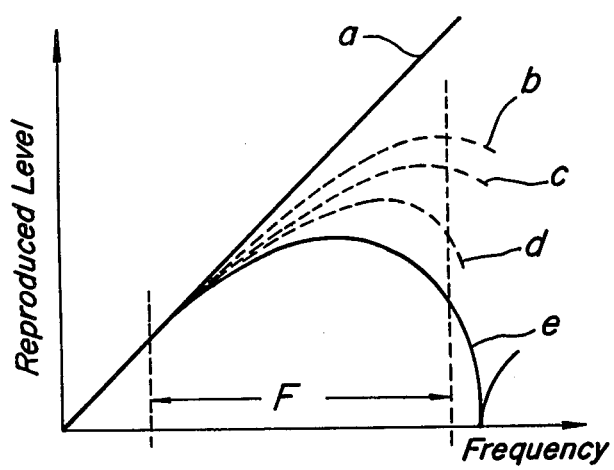
FIG. 1 is a graph showing magneto-electric converting characteristic curves of a magnetic head for recording and picking-up an image signal on and from a magnetic tape.
Figure 2:
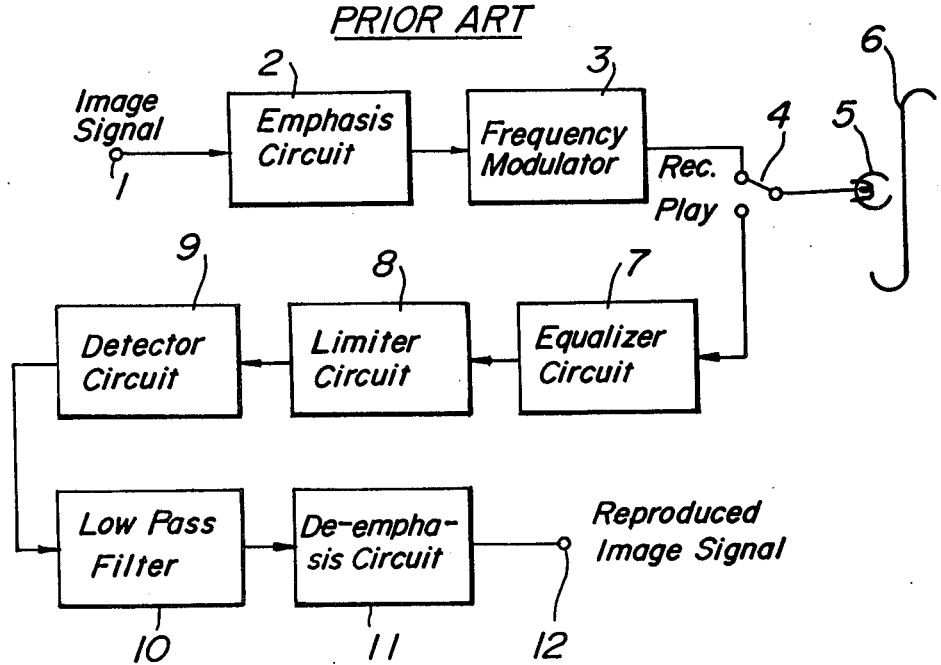
FIG. 2 is a block diagram illustrating a known magnetic video recording and reproducing apparatus.
Figure 5:
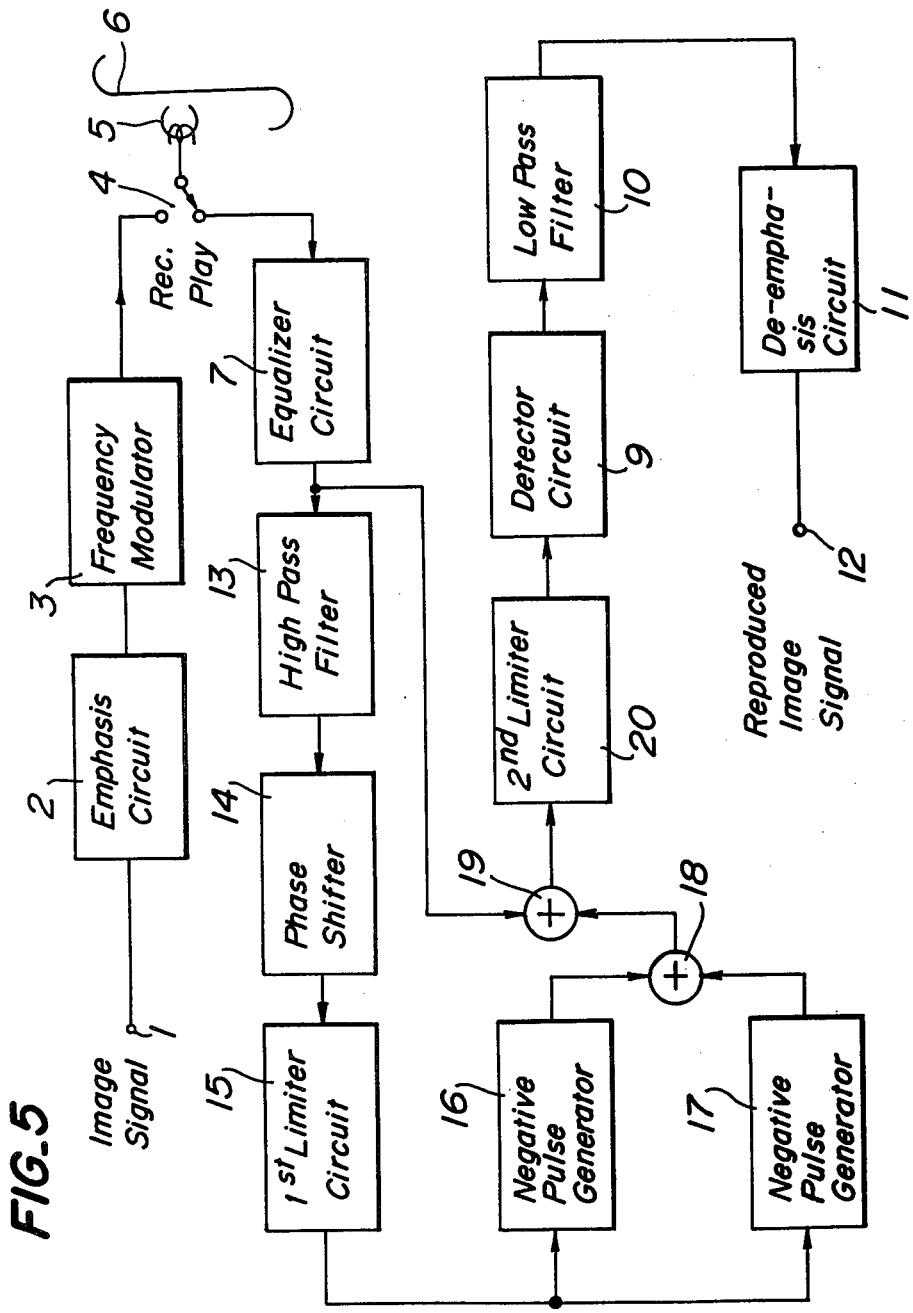
FIG. 5 is a block diagram showing an embodiment of the circuit according to the invention.

FIG. 5 is a block diagram showing an embodiment of the circuit for detecting a frequency modulated signal according to the invention for use in a video tape recorder. In FIG. 5 circuits which are same as those illustrated in FIG. 2 are denoted by the same reference numerals used in FIG. 2. A recording circuitry is entirely same as that of the known apparatus and an image signal is supplied from an input terminal 1 to an emphasis circuit 2 and a frequency modulator 3 to produce a frequency modulated wave, which is then supplied through a switch 4 to a magnetic head 5. In this manner, the frequency modulated wave is recorded on a magnetic tape 6.

Figure 6A:
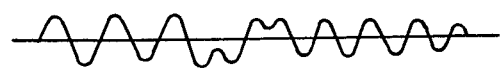
Figure 6B:
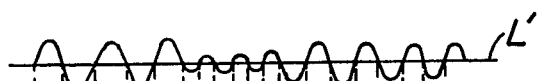

Upon reproduction, the switch 4 is changed into a position shown in FIG. 5 and the frequency modulated wave recorded on the magnetic tape 6 is picked-up by the magnetic head 5 to reproduce a frequency modulated wave. The reproduced frequency modulated wave is supplied to an equalizer circuit 7 and its frequency characteristic is compensated for to produce a frequency modulated wave shown in FIG. 6A which corresponds to the wave shown in FIG. 4C. The frequency modulated wave is then supplied to a high pass filter 13 to remove lower side-band components thereof and to derive only a frequency modulated carrier component illustrated in FIG. 6B. As shown in FIG. 6B, the output carrier component from the high pass filter 13 includes always zero cross points with respect to a level L' even in a high frequency range.

Figure 6D:

The frequency modulated carrier from the high pass filter 13 is supplied through a phase shifter 14 to a first limiter circuit 15 in which the zero cross points are detected to produce a first rectangular wave illustrated in FIG. 6C. The first rectangular wave is further supplied parallelly to positive and negative pulse generators 16 and 17 which are constructed to be triggered by front and rear edges, respectively of the first rectangular wave. Therefore, the positive and negative pulse generators 16 and 17 produce positive and negative pulse trains, respectively. FIG. 6D shows the positive pulse train supplied from the positive pulse generator 16 in response to front edges of the first rectangular wave and FIG. 6E illustrates the negative pulse train produced from the negative pulse generator 17 in response to the rear edges of the first rectangular wave. These positive and negative pulses have a constant pulse width which is shorter than a period of the maximum frequency of the frequency modulated wave. In the present embodiment, the pulse width is set to a quarter of the period of the maximum frequency, which is equal to about 150 nanoseconds.

Figure 6F:
Figure 6G:
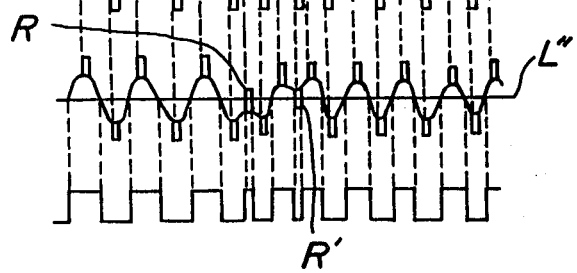

The positive and negative pulse trains supplied from the positve and negative pulse generators 16 and 17, respectively are mixed with each other by a first mixer 18 to generate a mixed pulse train illustrated in FIG. 6F. Then, the mixed pulse train thus obtained is further mixed in a second mixer 19 with the frequency modulated wave supplied from the equalizer circuit 7. It should be noted that a phase shifting amount, i.e. a delaying amount in the phase shifter 14 is so set that the center positions of respective pulses are made coincident with peak points of the sinusoidal frequency modulated wave. In this manner, the second mixer 19 produces a frequency modulated wave having pulses superimposed thereon as illustrated in FIG. 6G. It should be noted that an amplitude of the pulses is so selected that even if peak values of the frequency modulated wave have been shifted to the maximum extent in case of the highest modulation index, the frequency modulated wave having the positive and negative pulses superimposed thereupon has excursions beyond a zero cross detecting level L″ as illustrated in FIG. 6G. In FIG. 6G, points at which the superimposed pulses cross the level L″ are denoted by R and R′.

Figure 6H:

The frequency modulated wave having the pulses superimposed thereon is further supplied to a second limiter circuit 20 to detect zero crossing with respect to the detecting level L″ which is equal to an average level of the frequency modulated wave having the pulses superimposed thereon from the second mixer 19. Then the second limiter circuit 20 generates a second rectangular wave shown in FIG. 6H, which second rectangular wave represents only a frequency modulated component. As shown in FIG. 6H, the frequency modulated wave thus derived does not show any lack of the carrier component even if the image signal changes abruptly and in the worst case the positive and negative pulses having the given width appear in the second rectangular wave. In this manner, according to the invention the inverting phenomenon can be effectively removed.

The second rectangular wave thus derived is supplied to a detector circuit 9. In the present embodiment since use is made of the pulse count detection system, the detector circuit 9 multiplies the frequency of the second rectangular wave to produce pulses having a constant pulse width. These pulses are supplied to a low pass filter 10 to remove the frequency modulated component. An output signal from the low pass filter 10 is further supplied to a de-emphasis circuit 11 to correct the high frequency component which has been emphasized by the emphasis circuit 2 in the recording process to obtain at an output terminal 12 a reproduced image signal which has a flat frequency characteristic.

As explained above in detail, according to the invention, even if the reproduced frequency modulated wave including the fundamental component which has been subjected to an amplitude modulation to a great extent due to the emphasized lower side-band components, the lack of the frequency modulated fundamental wave can be effectively avoided and thus, the inverting phenomenon can be removed from the reproduced image signal.

What is claimed is:

1. A circuit for detecting a frequency modulated signal for use in a picture recording and reproducing apparatus including a circuit for frequency modulating a carrier with an image signal to produce a frequency modulated wave and a converting element for recording the frequency modulated wave on a record medium and for picking-up the recorded frequency modulated wave from the record medium to produce a reproduced frequency modulated wave, comprising first limiter means for detecting a fundamental wave in the reproduced freqency modulated wave to produce a first rectangular wave;
pulse generating means for producing, in response to the first rectangular wave, pulses having a constant pulse width which is shorter than a period of the maximum frequency of the reproduced frequency modulated wave;
mixing means for superimposing the pulses of the constant pulse width upon the reproduced frequency modulated wave to produce a pulse superimposed frequency modulated wave;
second limiter means for converting the pulse superimposed frequency modulated wave into a second rectangular wave; and
detecting means for demodulating the second rectangular wave to reproduce the image signal.

2. A circuit according to claim 1, wherein said pulse generating means comprises first and second pulse generators for producing positive and negative pulse trains, respectively in response to front and rear edges, respectively of the first rectangular wave.

3. A circuit according to claim 2, wherein said mixing means comprises a first mixer for combining said positive and negative pulse trains with each other to produce a combined pulse train and a second mixer for combining the combined pulse train with the reproduced frequency modulated wave.

4. A circuit according to any one of claims 2 and 3, further comprising a phase shifter for making center points of the positive and negative pulses coincident with peak points of the reproduced frequency modulated wave.

5. A circuit according to claim 4, wherein said phase shifter is provided at an input side of the first limiter means.

6. A circuit according to claim 1, wherein said first limiter means comprises a high pass filter for deriving the fundamental wave by removing lower side-band components, and a first limiter circuit for detecting zero crossing of the fundamental wave to produce the first rectangular wave.

7. A circuit according to claim 1, wherein said detecting means comprises a detector circuit for multiplying the frequency of the second rectangular wave to produce a pulse train having a constant pulse width, and a low pass filter for removing frequency modulated components to reproduce the image signal.

8. A circuit according to claim 1, further comprising an equalizer circuit provided at an input side of the first limiter means.

9. A circuit according to claim 1, further comprising a de-emphasis circuit provided at an output side of the detecting means.

10. A circuit according to claim 1, wherein said converting element comprises a magnetic head for recording and picking-up the frequency modulated wave on and from the record medium including a magnetic tape.

* * * * *